United States Patent
Romero

(10) Patent No.: US 6,497,048 B2
(45) Date of Patent: Dec. 24, 2002

(54) RESIST-DISPENSER NOZZLE CALIBRATION TOOL AND METHOD THEREOF

(75) Inventor: Gilda Yvonne Romero, San Antonio, TX (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 84 days.

(21) Appl. No.: 09/733,519

(22) Filed: Dec. 7, 2000

(65) Prior Publication Data

US 2002/0106579 A1 Aug. 8, 2002

(51) Int. Cl.⁷ .............................................. G01D 18/00
(52) U.S. Cl. ......................................... 33/644; 33/520
(58) Field of Search ........................ 33/644, 520, 533, 33/613, 645, 562; 414/935, 941

(56) References Cited

U.S. PATENT DOCUMENTS

| | | | |
|---|---|---|---|
| 3,461,566 A | * 8/1969 | Gerstner | 356/138 |
| 3,844,655 A | * 10/1974 | Johannsmeier | 355/43 |
| 4,914,866 A | * 4/1990 | Jackson et al. | 51/72 R |
| 5,449,282 A | * 9/1995 | Brown et al. | 425/190 |
| 6,129,040 A | * 10/2000 | Viggiano et al. | 118/323 |
| 6,151,793 A | * 11/2000 | Carlen | 33/645 |
| 6,241,507 B1 | * 6/2001 | Kuo | 425/472 |

OTHER PUBLICATIONS

Elliot, David J. *Integrated Circuit Fabrication Technology.* 1982 McGraw–Hill. pp. 125–144.

U.S. patent application Ser. No. 06/032512, Li, filed Mar. 7, 2000.

* cited by examiner

*Primary Examiner*—Christopher W. Fulton
*Assistant Examiner*—Tania Courson
(74) *Attorney, Agent, or Firm*—Peter Zawilski

(57) ABSTRACT

In a semiconductor liquid application apparatus, a calibration tool enables the rapid and accurate adjustment of height and center of a liquid dispense nozzle. In an example embodiment, the tool comprises a circular disk in which a first beveled out area corresponding to the shape of the liquid dispense nozzle is defined on the topside of the disk. Underneath the disk, a second beveled out area corresponding to the shape of the wafer chuck is defined therein. The calibration depth is determined by the thickness of the tool's substrate less the sum of the depth of the first beveled out area and the depth of the second beveled out area. This calibration depth is determined by the configuration of the nozzle used in a liquid-dispense spinner. In using the calibration tool, the nozzle height and center becomes more repeatable from operator-to-operator and machine-to-machine.

8 Claims, 4 Drawing Sheets

RESIST-DISPENSER NOZZLE CALIBRATION TOOL AND METHOD THEREOF

FIELD OF INVENTION

The present invention is generally directed to the manufacture of a semiconductors device. In particular, the present invention relates to a tool and method for calibrating the dispensing of liquids on a wafer substrate.

BACKGROUND OF INVENTION

The electronics industry continues to rely upon advances in semiconductor technology to realize higher-functioning devices in more compact areas. For many applications, realizing higher-functioning devices requires integrating a large number of electronic devices onto a single silicon wafer. As the number of electronic devices per given area of the silicon wafer increases, the manufacturing process becomes more difficult.

A large variety of semiconductor devices have been manufactured having various applications in numerous disciplines. Such silicon-based semiconductor devices often include metal-oxide-semiconductor (MOS) transistors, such as P-channel MOS (PMOS), N-channel MOS (NMOS) and complementary MOS (CMOS) transistors, bipolar transistors, BiCMOS transistors.

One important step in manufacturing is the formation of devices, or portions thereof, using photolithography and etching processes. In photolithography, a wafer substrate is coated with a light-sensitive material called photo-resist. Next, the wafer is exposed to light; the light striking the wafer is passed through a mask plate. This mask plate defines the desired features to be printed on the substrate. After exposure, the resist-coated wafer substrate is developed. The desired features as defined on the mask are retained on the photoresist-coated substrate. Unexposed areas of resist are washed away with a developer. The wafer having the desired features defined is subjected to etching. Depending upon the production process, the etching may either be a wet etch, in which liquid chemicals are used to remove wafer material or a dry etch, in which wafer material is subjected to a radio frequency (RF) induced plasma.

As device geometry approaches the sub-micron realm, preparation of the wafer for photolithography becomes increasingly important. Integral to successful wafer fabrication, is the consistent and reliable application of photoresist. Improper application of photoresist on the wafer substrate may result in having to rework the wafer at the given process step. Rework results in higher production costs and oftentimes, lower product yield.

Photoresist is often applied to a substrate that is mounted on a chuck in a machine that spins-on the resist. The wafer is loaded on the chuck and held down with vacuum. Through a nozzle, a measured amount of resist is deposited on the wafer. The chuck is rotated at high speed and the centrifugal force on the surface of the wafer spreads the resist across the wafer. A number of parameters determine the characteristics of the applied photoresist.

Conditions that may affect the quality of the photoresist coating may include viscosity of the resist compound, the height and centering of the dispense nozzle with respect to the wafer, hold-down vacuum on the chuck, the speed of the spinner as it is affected by equipment wear. Thus, it behooves the user to monitor the equipment and process for consistency and reliability.

Assuring the uniform dispense of photoresist on the wafer substrate requires that the dispenser nozzle be centered. For example, one technique uses a 200 mm plastic disk marked in even sections having the appearance of a sliced pie. Refer to FIG. 1. Disk 100 is sliced into eight pieces 110. The center point 120 is defined by the intersection of the pieces 110. The disk is placed on the chuck and the nozzle height and centering is adjusted using the disk 100 as a reference. The equipment operator determines the correct height and centering. In an example process, a nozzle height of about 5.5 mm has been found optimal. Depending upon the specific machine, the operator may either center the nozzle manually (by adjusting knobs and other controls) or center the nozzle via software program control of the machine.

This technique is susceptible to operator interpretation and variation. Consequently, there may be lot-to-lot variation in the photo resist application owing to differences in initial equipment setups. Over time, the technique may lack repeatability and consistency.

There exists a need to provide a tool and method of assuring aligned and accurate application of photoresist on the wafer substrate. Consequently, wafer loss from improper photoresist application is minimized, thereby increasing wafer yields and lowering production costs.

SUMMARY OF INVENTION

The present invention is exemplified in a number of implementations, one of which is summarized below. A calibration tool is used to adjust the height and center of a liquid dispenser nozzle with respect to the wafer chuck. Use of such a tool minimizes the operator-to-operator and machine-to-machine variability of photoresist application on the wafer substrate. In accordance with one embodiment of the present invention, a tool for calibrating a height and center of a dispenser nozzle with respect to a wafer-holding chuck in a spinner apparatus comprises a substrate of a predetermined thickness and predetermined shape having a top surface and a bottom surface. The top surface has a depression of a first depth and cross-section defined substantially about the middle of the top surface. The bottom surface has a depression of a second depth and cross-section defined substantially about the middle of the bottom surface. The top surface depression is coaxial with the bottom surface depression. A further feature of this embodiment is that the first depth and cross-section of the top surface depression corresponds to a depth and cross-section of the dispense nozzle. An additional feature is the second depth and cross-section of the bottom surface depression corresponds to a depth and cross-section of the wafer-holding chuck. A further feature is that a calibration depth is determined by the thickness of the substrate less the sum of the first depth of the top surface depression plus the second depth of the bottom surface depression substantially about the middle of the depressions. Thus after adjustment, the calibration depth corresponds to the height of the dispense nozzle with respect to the wafer chuck.

In another embodiment according to the present invention, a spinner apparatus has dispenser calibration. The calibration comprises a tool for calibrating a height and center of a dispenser nozzle with respect to a wafer-holding chuck in the spinner apparatus. A storage area in the spinner apparatus retains the tool. A substrate holding clamp retrieves the tool from the storage area. A controller activates the substrate-holding clamps for retrieving the tool from the storage area, places the tool on the wafer-holding chuck, and performs calibration of the height and center of the dispenser nozzle. A feature of this embodiment is that the controller may be a computer system whose calibration commands are stored in a computer-readable medium.

In yet another embodiment according to the present invention, a method for calibrating the height and center of a resist-dispenser nozzle in a spinner apparatus comprises placing a calibration tool on the wafer chuck. The calibration tool comprises a substrate of a predetermined thickness and shape having a top surface and a bottom surface. The top surface has a depression of a first depth and cross-section defined therein substantially about the middle of the top surface. The bottom surface has a depression of a second depth and cross-section defined therein substantially about the middle of the bottom surface. The top surface depression is coaxial with the bottom surface depression. The resist-dispenser nozzle is inserted in the depression of the top surface of the tool at a calibration depth defined by the first depth.

The above summaries of the present invention are not intended to represent each disclosed embodiment, or every aspect, of the present invention. Other aspects and example embodiments are provided in the figures and the detailed description that follows.

BRIEF DESCRIPTION OF THE DRAWINGS

The invention may be more completely understood in consideration of the following detailed description of various embodiments of the invention in connection with the accompanying drawings, in which.

Figure 1:
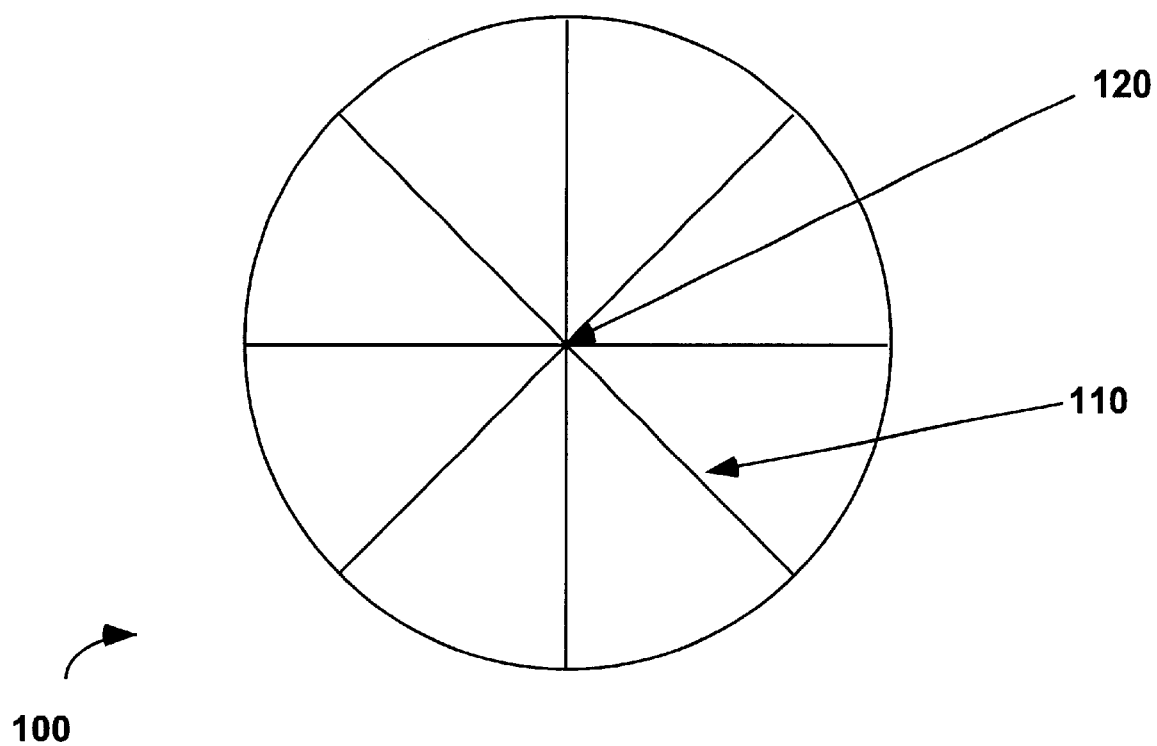
FIG. 1 (Prior Art) is a top view of an example alignment disk used to adjust the center and height of a resist dispenser nozzle.

While the invention is susceptible to various modifications and alternative forms, specific embodiments thereof have been shown by way of example in the drawings and will herein be described in detail.

DETAILED DESCRIPTION

The present invention has been found to be useful and advantageous in connection with the application of photoresist or other process chemicals on a semiconductor substrate. Other process chemicals may include spin-on glass (SOG), resist developer, poly-amide resins, or other coatings dispensed in liquid form. In applying photoresist onto the substrate, consistency from wafer-to-wafer and lot-to-lot assures repeatable reproduction of circuit elements on the photo masks. A nozzle centering tool enables the user to gauge the position of the dispense nozzle with respect to the wafer substrate.

On its top surface, the nozzle calibration tool has a bevel in the center of the tool to precisely align the dispense nozzle. Also the bevel is of a desired height so that the appropriate height of the nozzle may be set, as well. On the underside, the tool has a bevel cut into it so that it mates with the wafer chuck. The bevel is cut, angled so that it fits on the chuck at its center. The operator does not have to use judgment to align the tool in that it attaches to the wafer chuck in the proper location and orientation.

Figure 2A:
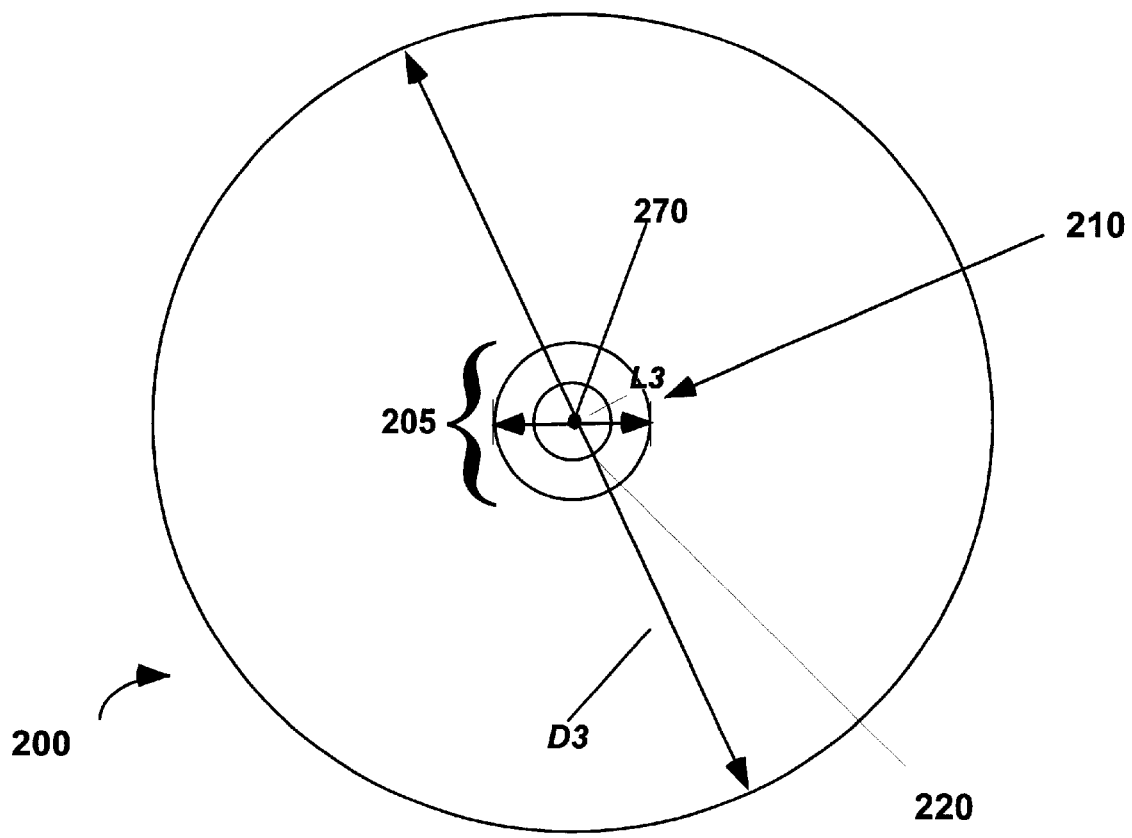
FIG. 2A depicts a top view of the nozzle-calibration tool according to an embodiment of the present invention.

Refer to FIG. 2A. In an example embodiment according to the present invention, a nozzle-centering tool 200 has a small beveled out area 205 at its center. The beveled area 205 enables the operator to center accurately the resist dispenser nozzle. The area 205 may be any shape that would enhance the ease of alignment. Such shapes may be a polygon or circular. An additional reference mark, such as a cross, may be defined in the center 270 of area 205 to aid the operator in centering the nozzle. The nozzle-centering bevel 205 may also be shaped to fit that of the dispense tip being used. For example, a bevel having an outer diameter 210 and an inner diameter 220 is matched to the corresponding dimensions of the dispense tip. The centering bevel 205 depth corresponds to the appropriate nozzle height.

Figure 2B:
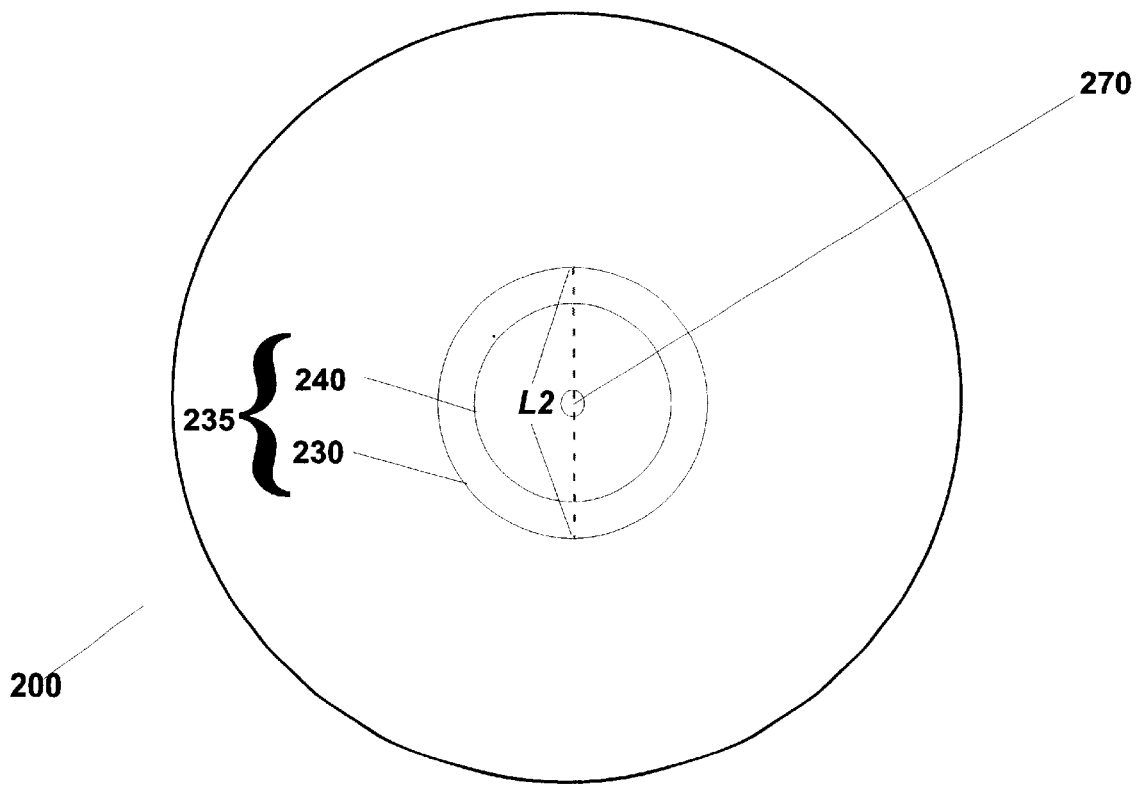
FIG. 2B depicts the underside of the nozzle-calibration tool of FIG. 2A.

Refer to FIG. 2B. The underside of the nozzle-centering tool 200 has a beveled out area 235. The bevel slopes from an outside diameter 230 to an inside diameter 240. The slope of the bevel is cut so that it matches a corresponding bevel on the wafer chuck. In an example embodiment, the nozzle-centering tool 200 may be made of a resilient material such as a solvent-resistant plastic. As the tool is placed on the chuck, the slight stretching of the material anchors it frictionally at the beveled out area 235 with the corresponding area of the chuck. In a resist spinning apparatus, a wafer chuck often employs vacuum to hold the silicon wafers. Thus, during the calibration operation, the tool may be further held onto the wafer chuck with vacuum as well as frictional forces.

Figure 2C:
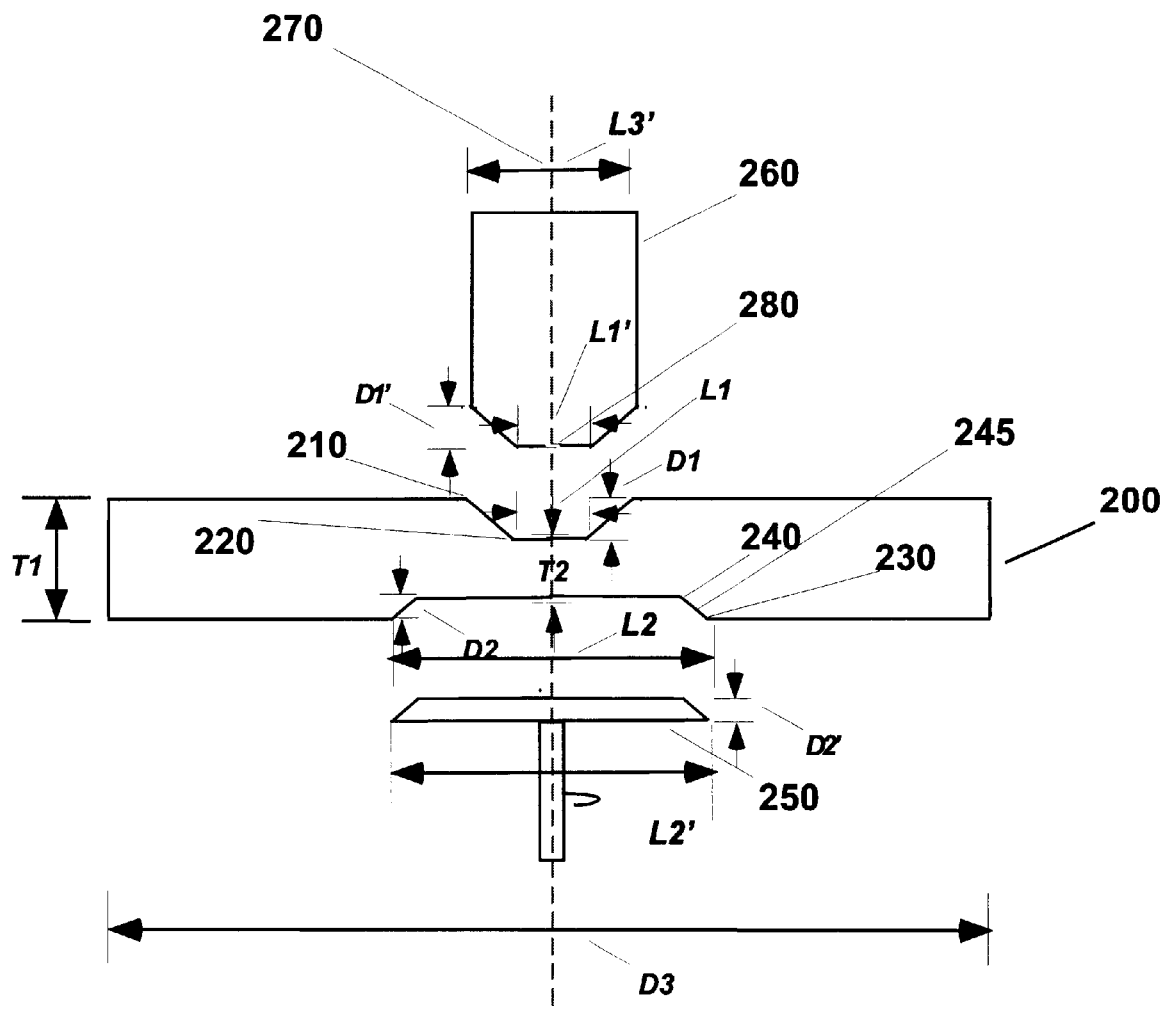
FIG. 2C shows in cross-section the nozzle-calibration tool of FIG. 2A and FIG. 2B.

Refer to FIG. 2C. The nozzle-centering tool 200 is depicted in cross-section in center alignment 270 (as depicted by a dashed line) to a wafer chuck 250 and a resist-dispense nozzle 260 having an orifice 280. The thickness T1 is determined by the specifics of the resist-dispense apparatus and the materials used to construct the tool. Such materials may include TEFLON®, glass, polypropylene, FLUOROWARE® plastics. The material must be resistant to acids/solvents and be capable of machining. In an example embodiment, the thickness T1 of the tool may range from about 5 mm to about 15 mm. The diameter of the tool 200 is determined by the diameter of wafer substrates processed in the manufacturing facility. For example, a 200 mm (~8 inch) wafer resist spinner would use a nozzle centering tool having a diameter comparable to that of the wafer substrate. Such a resist spinner may have one or more tracks. More tracks allow for multiple parallel application of photo resist on wafer substrates for higher throughput. The dispenser nozzle is aligned individually for each track.

Refer to the topside of the tool 200 (FIG. 2A). In an example embodiment according to the present invention, for a 200 mm disk, the beveled area 205 has an inner diameter 220 in the range of about 3.40 mm to about 3.45 mm and an outer diameter in the range of about 6.80 to about 6.90 mm. As shown in FIG. 2C, the depth D1 and cross-section of the tool 200 corresponds to the depth D1' and cross-section of the resist-dispense nozzle 260. The cross-section of the resist-dispense nozzle may be flat as shown in FIG. 2C or may taper to a point. The particular liquid dispensed would influence the choice of nozzle cross-section. In that the resist-dispense nozzle 260 fits into the bevel area 205, the resist-dispense nozzle 260 is centered with respect to the wafer chuck 250. The operator subjectivity, the track-to-track variation, and machine-to-machine variation are eliminated.

TABLE 1

Dimensions for an Example Alignment Tool.

| Item | Label | Dimensions (mm) Tolerances ± 0.5 mm |
|---|---|---|
| Resist Nozzle | L3' | 6.8 |
| Resist Nozzle | L1' | 3.4 |
| Resist Nozzle | D1' | 8.9 |
| Alignment Tool | D3 | 200.0 (Used for ~200 mm substrate) |
| Alignment Tool | T1 | 20.8 |
| Alignment Tool | T2 | 5.0 |
| Alignment Tool | L2 | ~79.9 (same as L2' to fit on chuck) |
| Wafer Chuck | L2' | 79.9 |
| Wafer Chuck | D2' | 6.9 |

Refer to FIG. 2B, the underside of the tool 200. The beveled area 235 has an inner diameter 240 in the range of about 79 mm to about 80 mm and an outer diameter 230 of about 82 mm. The slope 245 of the beveled area 235 is about 5 mm vertical/2 mm horizontal. Depending upon the spinner apparatus wafer chuck design, the angle of the slope 245 may range from about 30° to vertical. The depth D2 and length L2 of the beveled area 235 is determined by the corresponding dimensions, depth D2' and L2' of the wafer chuck. The thickness T2, at which the nozzle 260 in relation to the wafer chuck 250 is calculated from the thickness T1 of the substrate less then nozzle depth D1 and wafer chuck depth D2. For an example tool, the T2 thickness is about 5 mm for a calibrated nozzle height.

In an example resist spinner, the wafer chuck employs vacuum to hold down the wafer substrates. Thus, a nozzle-centering tool, according to the present invention, is held down initially by friction force but receives extra vacuum force when calibration is done. In an example embodiment of the nozzle-centering tool, a pattern may be defined as an array of dimples on the underside to better enable the vacuum force of the chuck to grip the tool.

For a specific example embodiment according to the present invention, refer to Table 1. Parameters listed are derived from use of a DNS Model 80B resist spinner. A given model or brand of machine has specific parameters for a calibration tool built according to the present invention.

In another example resist spinner, the nozzle-centering tool may be stored internally by the machine. During a nozzle calibration procedure, a substrate-holding clamp retrieves the tool, place it on the wafer chuck. In one example apparatus, the substrate-holding clamp may be a spatula-like device. The clamp slides under the tool and carries it to the wafer chuck. Perforations in the spatula enable the use of vacuum to prevent tool slippage. Through software control, the machine may automatically perform the procedure as discussed earlier. After centering and adjusting the height of the nozzle, the substrate-holding clamps remove the tool from the wafer chuck and return it to the storage area.

In that a standard tool is used to adjust the height and center of the liquid dispense nozzle, the track-to-track variation as well as operator-to-operator variation is reduced. Consequently, the applied liquid on the wafer substrates is more consistent resulting in less feature variation during wafer processing.

While the present invention has been described with reference to several particular example embodiments, those skilled in the art will recognize that many changes may be made thereto without departing from the spirit and scope of the present invention, which is set forth in the following claims.

What is claimed:

1. A tool in combination with a resist-dispenser nozzle and a wafer-holding chuck in a spinner apparatus, for calibrating a height and center of the resist-dispenser nozzle, comprising:

a substrate of a predetermined thickness and shape having a top surface and a bottom surface;

the top surface having a depression of a first depth and cross-section defined therein substantially about the middle of the top surface, the bottom surface having a depression of a second depth and cross-section defined therein substantially about the middle of the bottom surface, the top surface depression coaxial with the bottom surface depression;

wherein the first depth and cross-section of the top surface depression corresponds to a depth and cross-section of the dispenser nozzle; and wherein the second depth and cross-section of the bottom surface depression corresponds to a depth and cross-section of the wafer-holding chuck.

2. The tool as recited in claim 1 wherein the shape of the tool is selected from group of: regular polygons, circle.

3. The tool as recited in claim 1 wherein, a calibration depth is determined by the thickness of the substrate less the sum of first depth of the top surface depression and the second depth of the bottom surface depression substantially about the middle of the depressions, the calibration depth corresponding to the height of the resist dispenser nozzle with respect to the wafer chuck.

4. The tool as recited in claim 1 wherein, the substrate is comprised of a resilient material.

5. The tool as recited in claim 4 wherein, the bottom surface depression comprises the second depth and a shape corresponding to a similar depth and shape of the wafer chuck, the bottom surface depression frictionally mounting upon the wafer chuck.

6. The tool as recited in claim 5, wherein the bottom surface depression is patterned to facilitate vacuum adhesion.

7. The tool as recited in claim 6, wherein the bottom surface depression is patterned as an array of dimples, each dimple having at least three sides.

8. The tool as recited in claim 6 wherein the resilient material includes at least one of the following: glass, plastic, poly-propylene, TEFLON®, FLUOROWARE®.

* * * * *